(12) United States Patent
Hamaguchi et al.

(10) Patent No.: US 9,136,309 B2
(45) Date of Patent: *Sep. 15, 2015

(54) ORGANIC ELECTROLUMINESCENT DISPLAY

(71) Applicant: CANON KABUSHIKI KAISHA, Tokyo (JP)

(72) Inventors: Atsushi Hamaguchi, Yokohama (JP); Nobutaka Mizuno, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/069,177

(22) Filed: Oct. 31, 2013

(65) Prior Publication Data

US 2014/0054576 A1 Feb. 27, 2014

Related U.S. Application Data

(63) Continuation of application No. 13/185,717, filed on Jul. 19, 2011, now Pat. No. 8,618,559.

(30) Foreign Application Priority Data

Jul. 21, 2010 (JP) ................. 2010-163790

(51) Int. Cl.
*H01L 27/32* (2006.01)
*H01L 51/50* (2006.01)
*H01L 51/52* (2006.01)

(52) U.S. Cl.
CPC ........ *H01L 27/3218* (2013.01); *H01L 51/5265* (2013.01); *H01L 27/3211* (2013.01); *H01L 51/5048* (2013.01); *H01L 51/5218* (2013.01); *H01L 2251/558* (2013.01)

(58) Field of Classification Search
CPC ............ H01L 51/5265; H01L 27/3211; H01L 27/322; H01L 2351/5315; H01L 51/5262; H01L 27/3244; H01L 2251/558
See application file for complete search history.

(56) References Cited

U.S. PATENT DOCUMENTS

| | | | |
|---|---|---|---|
| 7,538,481 B2 * | 5/2009 | Kim | 313/500 |
| 7,750,563 B2 * | 7/2010 | Hasegawa | 313/506 |
| 7,915,812 B2 * | 3/2011 | Hasegawa | 313/504 |

(Continued)

FOREIGN PATENT DOCUMENTS

| | | |
|---|---|---|
| JP | 2006-179780 A | 7/2006 |
| JP | 2006-295104 A | 10/2006 |
| JP | 2010-146738 A | 7/2010 |

*Primary Examiner* — Jaehwan Oh
(74) *Attorney, Agent, or Firm* — Canon USA Inc. IP Division

(57) ABSTRACT

An organic electroluminescent (EL) display includes a plurality of organic EL devices for red, green, and blue subpixels, each including a first electrode on a light output side, a second electrode opposite the first electrode, and an organic compound layer including a light-emitting layer therebetween. The organic EL devices have a resonator structure between a first reflective surface closer to the first electrode than the organic compound layer and a second reflective surface closer to the second electrode than the organic compound layer. A predetermined white color is displayed by mixing the three colors such that an optical distance of the organic EL devices of each color between an emission position in the light-emitting layer and the second reflective surface is set within ±10% from an optical distance corresponding to an nth-order minimum of a curve of required current density against at least the optical distance.

7 Claims, 8 Drawing Sheets

(56) References Cited

U.S. PATENT DOCUMENTS

| | | | |
|---|---|---|---|
| 7,923,920 B2* | 4/2011 | Nakamura | 313/504 |
| 8,004,189 B2* | 8/2011 | Hasegawa et al. | 313/512 |
| 8,102,118 B2* | 1/2012 | Lee et al. | 313/506 |
| 8,188,500 B2* | 5/2012 | Hasegawa et al. | 257/98 |
| 8,205,999 B2* | 6/2012 | Karman et al. | 362/97.1 |
| 8,227,796 B2* | 7/2012 | Asaki et al. | 257/40 |
| 8,227,978 B2* | 7/2012 | Lee et al. | 313/506 |
| 2004/0012330 A1* | 1/2004 | Ohshita et al. | 313/504 |
| 2006/0091380 A1* | 5/2006 | Yuuki et al. | 257/40 |
| 2006/0119251 A1* | 6/2006 | Kim | 313/500 |
| 2006/0226767 A1 | 10/2006 | Tyan | |
| 2006/0290274 A1* | 12/2006 | Oota | 313/506 |
| 2007/0154733 A1* | 7/2007 | Fukuoka et al. | 428/690 |
| 2007/0228367 A1* | 10/2007 | Nakamura | 257/40 |
| 2007/0252520 A1* | 11/2007 | Hasegawa | 313/504 |
| 2007/0284564 A1* | 12/2007 | Biwa et al. | 257/13 |
| 2007/0296334 A1* | 12/2007 | Matsuda | 313/506 |
| 2008/0203908 A1* | 8/2008 | Hasegawa et al. | 313/504 |
| 2008/0224968 A1* | 9/2008 | Kashiwabara | 345/83 |
| 2009/0096358 A1* | 4/2009 | Lee et al. | 313/504 |
| 2009/0096359 A1* | 4/2009 | Lee et al. | 313/504 |
| 2009/0102362 A1* | 4/2009 | Lee et al. | 313/504 |
| 2009/0121239 A1* | 5/2009 | Asaki et al. | 257/89 |
| 2009/0212692 A1* | 8/2009 | Hasegawa | 313/504 |
| 2009/0213568 A1* | 8/2009 | Karman et al. | 362/97.1 |
| 2009/0296366 A1* | 12/2009 | Shikina et al. | 362/19 |
| 2010/0053043 A1* | 3/2010 | Sakamoto | 345/77 |
| 2010/0155711 A1* | 6/2010 | Hasegawa et al. | 257/40 |
| 2010/0157131 A1* | 6/2010 | Kamatani et al. | 348/333.11 |
| 2011/0101855 A1* | 5/2011 | Mizuno | 313/504 |
| 2011/0207255 A1* | 8/2011 | Sakakura et al. | 438/34 |
| 2012/0193619 A1* | 8/2012 | Taka et al. | 257/40 |
| 2012/0299031 A1* | 11/2012 | Shiratori | 257/89 |

\* cited by examiner

ORGANIC ELECTROLUMINESCENT DISPLAY

CROSS REFERENCE TO RELATED APPLICATIONS

This application is a Continuation of U.S. patent application Ser. No. 13/185,717 filed Jul. 19, 2011, which claims priority to Japanese Patent Application No. 2010-163790 filed Jul. 21, 2010, each of which are hereby incorporated by reference herein in their entireties.

BACKGROUND OF THE INVENTION

1. Field of the Invention

The present invention relates to organic electroluminescent (EL) displays having a plurality of organic EL devices, each including electrodes and an organic compound layer including a light-emitting layer therebetween, and particularly to an organic EL display having a resonator structure.

2. Description of the Related Art

Organic EL displays are displays having a plurality of organic EL devices arranged, for example, in a matrix. Organic EL devices, also called organic light-emitting devices, have a layered structure in which an organic compound layer including a light-emitting layer is held between an anode and a cathode. As a current flows through the organic compound layer, electrons and holes are injected from the electrodes to generate excitons. The organic EL devices are based on the property of the excitons emitting light as they return to the ground state.

Organic EL displays, which have high contrast and are thin because they are self-emitting, have recently attracted attention as a promising flat-panel display and have been developed extensively. In addition, organic EL displays are suitable for video display because they have significantly higher response speeds than liquid crystal displays.

For organic EL displays and organic EL devices, various techniques have been proposed in which the optical thickness between the anode and the cathode is controlled to improve light output efficiency and color purity by optical interference.

Japanese Patent Laid-Open No. 2000-323277 proposes a technique for providing an organic EL display having high light output efficiency by setting a different thickness to each color of light emitted for any of the functional layers in the organic compound material layer.

In addition, U.S. Pat. No. 6,469,438 proposes an organic EL device having the color robustness thereof improved using an extremum of chromaticity and a method for producing the organic EL device.

In the technique disclosed in Japanese Patent Laid-Open No. 2000-323277, however, the total amount of current through all subpixels during display of white color is not necessarily minimized even if the luminous efficiency (current-luminance efficiency) of subpixels of one color is maximized. For display of white color, red (R), green (G), and blue (B) subpixels are turned on in a predetermined proportion; the amount of current required for display of a white color with the desired chromaticity varies with the chromaticities that the organic EL devices of the subpixels show frontward. For example, in the case of blue devices having a higher luminous efficiency and a lighter chromaticity (higher CIEy) and blue devices having a lower luminous efficiency and a deeper chromaticity (lower CIEy), the former ones may require a larger amount of current for display of white color despite their higher luminous efficiency. Thus, the amount of current required is not necessarily determined only by the luminous efficiency.

According to the technique disclosed in U.S. Pat. No. 6,469,438, on the other hand, a display with a smaller color shift can be produced by setting the color of organic EL devices of subpixels to an extremum of chromaticity, although the display has a higher power consumption.

SUMMARY OF THE INVENTION

An organic EL display according to an aspect of the present invention includes a plurality of organic EL devices for red, green, and blue subpixels, each including a first electrode on a light output side, a second electrode opposite the first electrode, and an organic compound layer including a light-emitting layer therebetween. The organic EL devices have a resonator structure configured to resonate light emitted from the light-emitting layer between a first reflective surface closer to the first electrode than the organic compound layer and a second reflective surface closer to the second electrode than the organic compound layer. A predetermined white color is displayed by mixing the three colors such that an optical distance of the organic EL devices of each color between an emission position in the light-emitting layer and the second reflective surface is set within ±10% from an optical distance corresponding to an nth-order minimum of a curve of required current density against at least the optical distance.

Further features of the present invention will become apparent from the following description of exemplary embodiments with reference to the attached drawings.

DESCRIPTION OF THE EMBODIMENTS

Figure 1:
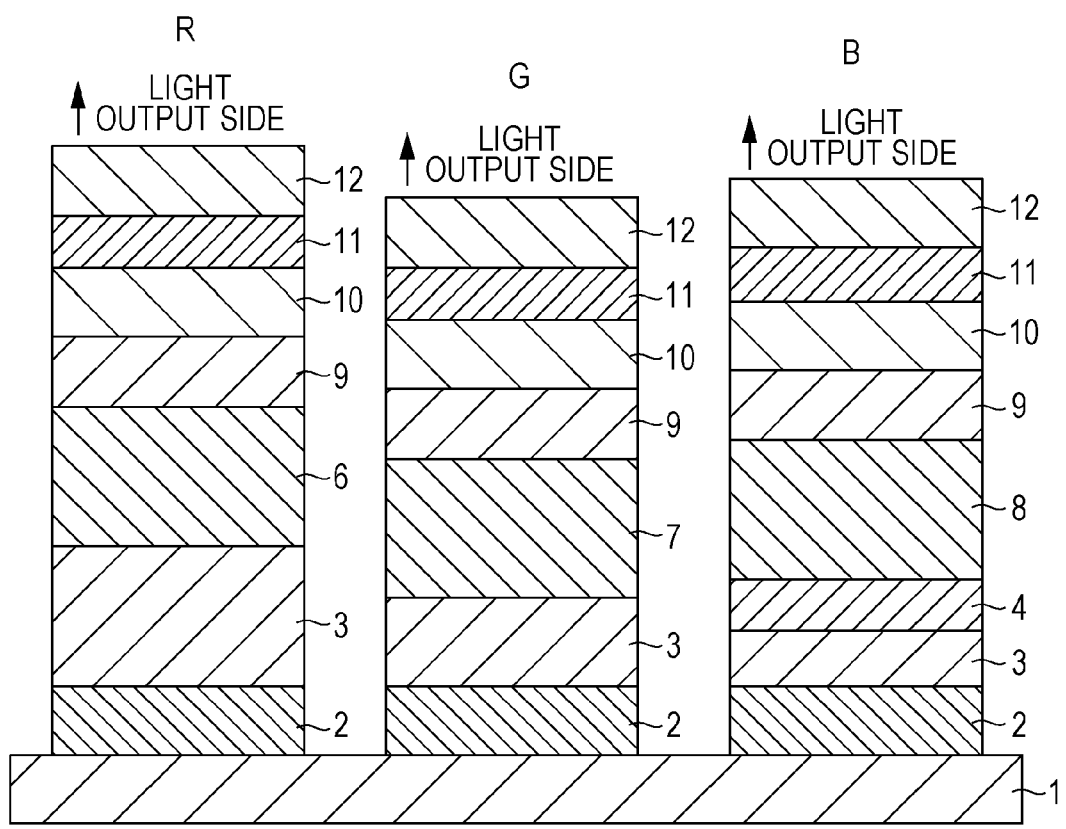
FIG. 1 is a schematic diagram showing the layered structure of an organic EL display according to an embodiment of the present invention.

An embodiment of the present invention will now be described with reference to the drawings, although the present invention is not limited to the embodiment. In the drawings, various layers are enlarged enough to be identifiable for illustrative purposes and are therefore not to scale. In addition, the techniques known in the art are applied unless otherwise illustrated or described.

First, the layered structure of organic EL devices of an organic EL display according to an embodiment of the present invention will be described with reference to FIG. 1. FIG. 1 is a schematic diagram showing the layered structure of the organic EL devices of the organic EL display according to this embodiment. The organic EL display according to this embodiment shown in FIG. 1 includes a plurality of top-emission organic EL devices; the user views the display from a light output side opposite a substrate side. In addition, the organic EL display according to this embodiment is a color display including organic EL devices for subpixels of three colors, namely, red (R), green (G), and blue (B). The red subpixels are designated by R, the green subpixels are designated by G, and the blue subpixels are designated by B, if necessary.

In the following description, the term "emission position" refers to a position where a peak appears in the emission intensity distribution of an organic EL device along the thickness thereof. The term "resonator structure," also called the microresonator structure or the microcavity structure, refers to all structures based on optical interference. Examples of resonator structures include a metal cavity structure having a reflective film at one end and a semitransparent metal film at the other end, a structure having a reflective film at one end and an interface between a void and a semitransparent film at the other end such that the interface forms the largest refractive index step, and a structure having a reflective film at one end and a dielectric mirror at the other end.

The organic EL devices of the organic EL display according to this embodiment each have at least two electrodes. In the following description, an electrode disposed on the light output side is referred to as a first electrode, and an electrode disposed opposite the first electrode with an organic compound layer therebetween is referred to as a second electrode. In addition, a reflective surface closer to the first electrode than the organic compound layer is referred to as a first reflective surface, and a reflective surface closer to the second electrode than the organic compound layer is referred to as a second reflective surface.

In the organic EL display according to this embodiment, as shown in FIG. 1, the first electrode is a cathode 12, and the second electrode is an anode 2. In addition, the first reflective surface is formed at an interface between the cathode 12 and a void on the light output side of the cathode 12, and the second reflective surface is formed at an interface of an reflective layer (not shown) of the anode 2 on the organic compound layer side. The void on the light output side of the cathode 12, which is inside a seal member (not shown), is filled with a gas such as nitrogen or argon so that the interface between the void and the cathode 12 forms the largest refractive index step in the organic EL device.

Aspects of the present invention are not limited to the above electrode configuration and may be applied to any configuration having a resonator structure. For example, it is possible to dispose the cathode on the substrate side and the anode on the light output side. In this case, the cathode includes at least a reflective layer, and the anode is a transparent electrode. For any configuration, an electrode having high transmittance can be used on the light output side.

Organic compound layers including light-emitting layers 6, 7, and 8 corresponding to red (R), green (G), and blue (B), respectively, are disposed between the anodes 2 and the cathodes 12. In this embodiment, the R and G organic compound layers have a layered structure including a hole transport layer 3, the light-emitting layer 6 or 7, a hole blocking layer 9, an electron transport layer 10, and an electron injection layer 11. The B organic compound layer, on the other hand, has a layered structure including a hole transport layer 3, an electron blocking layer 4, the light-emitting layer 8, a hole blocking layer 9, an electron transport layer 10, and an electron injection layer 11.

The layered structures of the organic compound layers are merely examples; the layers can be omitted or added. For example, it is optional to provide the electron blocking layer 4, which prevents electrons injected from the cathode 12 from leaking to the anode 2 without sufficiently recombining with holes in the light-emitting layer 8. It is also optional to provide the hole blocking layer 9, which prevents holes injected from the anode 2 from traveling to the cathode 12 without sufficiently recombining with electrons in the light-emitting layer 6, 7, or 8. The organic compound layers can be formed of known organic compound materials.

The organic EL devices according to this embodiment are produced by, for example, vacuum deposition of low-molecular-weight organic compound materials using a metal mask, although the method used is not limited to the example shown in this embodiment. For example, the organic compound materials used may instead be polymer materials. In addition, the process for forming the organic compound layers is not limited to vacuum deposition and may instead be, for example, a wet process such as spin coating.

The organic EL display according to this embodiment is produced as an active-matrix display including a substrate 1 having thin-film transistors (TFTs). To produce a full-color display, for example, red, green, and blue subpixels may be arranged in a matrix. The arrangement, however, is not limited thereto; for example, subpixels of four colors, such as red, green, blue, and white subpixels, red, green, blue, and blue subpixels, or red, green, green, and blue subpixels, may be arranged.

Examples of methods for forming R, G, and B subpixels on a substrate include separately forming patterns of light-emitting materials of the three primary colors of light, namely, R, G, and B, using a metal mask; converting white light into the three primary colors through a color filter; and converting blue light into green and red through color-changing media such as phosphors.

Of these methods, the method of separately forming patterns of R, G, and B light-emitting materials using a metal mask will be described as an example in this embodiment, although aspects of the present invention are not limited thereto.

Figure 2:
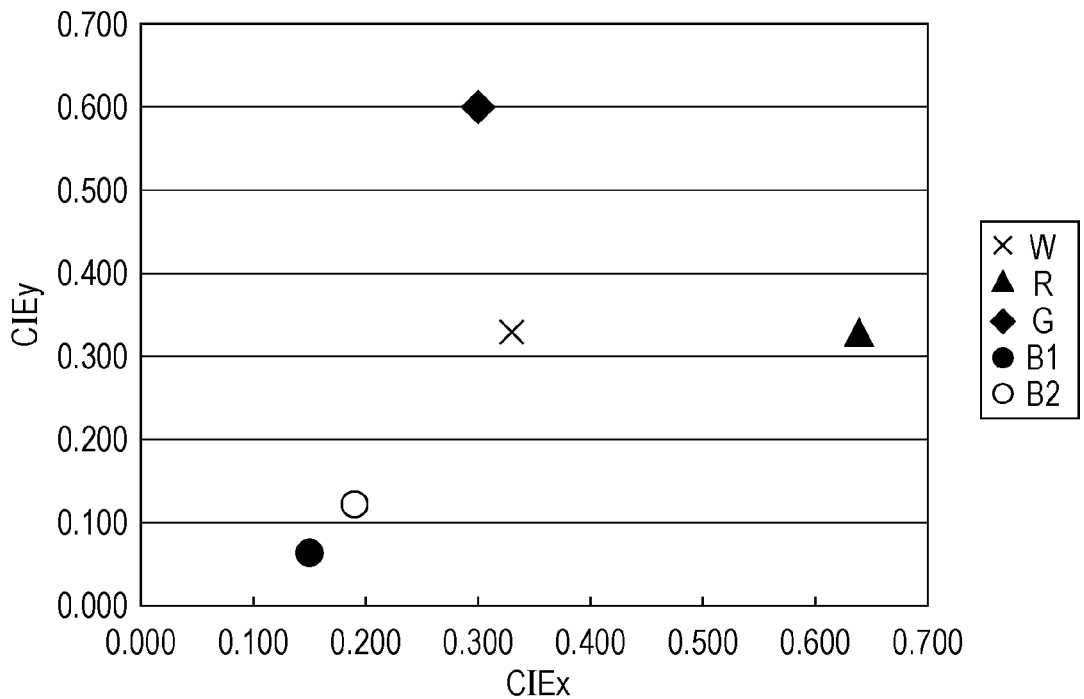
FIG. 2 is a graph showing CIE chromaticity coordinates.

First, the reason why the power consumption during display of white color is minimized taking into account both luminous efficiency and chromaticity, rather than using a configuration with the highest luminous efficiency, according to aspects of the present invention will be described using FIG. 2. FIG. 2 is a graph showing CIE chromaticity coordinates. In FIG. 2, W denotes the chromaticity of a predetermined white color of the display, R denotes the chromaticity of the red devices, and G denotes the chromaticity of the green devices.

Displaying the white color W on an organic EL display having R, G, and B subpixels will now be discussed. If the subpixels are sufficiently small, R, G, and B are mixed as seen from the viewer. Thus, the white color W can be displayed by lighting R, G, and B at predetermined luminances.

In FIG. 2, if R, G, and B are lit at a luminance ratio of $l_R:l_G:l_B$, they form a triangle having its center of gravity at W on the chromaticity coordinate system. In FIG. 2, if the coordinates of R, G, and W are fixed, the organic EL devices of the B subpixels have a lower CIEy (deeper chromaticity) and therefore require a higher luminance at a chromaticity B1 than at a chromaticity B2. This is because B1 is located farther away from W and therefore brings the center of gravity of the triangle formed by R, G, and B closer to B.

That is, $l_B$ is lower because B1 is farther away from the center of gravity W than B2. On the other hand, the luminous efficiency $\eta_B$ becomes higher toward B2. In general, the lower $l_B$ is, the lower the power consumption is, and the higher $\eta_B$ is, the lower the power consumption is. That is, the power consumption is minimized where $l_B/\eta_B$ is minimized. In view of minimizing the power consumption of an organic EL display during display of white color, therefore, it is inappropriate to determine the structure of the organic EL devices taking into account only the luminous efficiency so that the luminous efficiency is maximized; it is necessary to take into account both the luminous efficiency and the chromaticity.

Next, a method for minimizing the power consumption and required current of the organic EL display according to this embodiment will be more specifically described. In the organic EL devices according to this embodiment, at least the optical distance between the emission position in the organic compound layer and the second reflective surface is optimized.

First, the case where the optical distance between the emission position in the organic compound layer and the first reflective surface is fixed will be described. As an example, a method for minimizing the required current of the B subpixels in the case where the optical distances of the R and G subpixels have already been fixed will be described.

Assume that the chromaticity of the desired white color of the organic EL display is (Wx, Wy), the chromaticity of the red component of the light output is (Rx, Ry), and the chromaticity of the green component of the light output is (Gx, Gy). In this case, the optical distance of the B organic light-emitting devices between the emission position and the second reflective surface is adjusted so that the chromaticity (Bx, By) and current efficiency $\eta_B$ (cd/A) of the blue component allow $L_B/\eta B$ to be the minimum or within ±10% from the minimum.

The curves of the required current densities $i_R$, $i_G$, and $i_B$ for the respective colors are determined by substituting the luminances $L_R$, $L_G$, and $L_B$ (cd/m$^2$) and the current efficiencies $\eta_R$, $\eta_G$, and $\eta_B$ (cd/A) into $L_R/\eta_R$, $L_G/\eta_G$, and $L_R/\eta_B$, respectively.

The luminances $L_R$, $L_G$, and $L_B$ (cd/m$^2$) are calculated by the following equations:

$$L_R = L_W \times \frac{l_R}{l_R + l_G + l_B} \times \frac{100}{\text{polarizer transmittance}} \times$$
$$\frac{100}{\text{aperature ratio}} \times \frac{100}{100 - \text{optical loss}}$$ [Math. 1]

$$L_G = L_W \times \frac{l_G}{l_R + l_G + l_B} \times \frac{100}{\text{polarizer transmittance}} \times$$
$$\frac{100}{\text{aperature ratio}} \times \frac{100}{100 - \text{optical loss}}$$

$$L_B = L_W \times \frac{l_B}{l_R + l_G + l_B} \times \frac{100}{\text{polarizer transmittance}} \times$$
$$\frac{100}{\text{aperature ratio}} \times \frac{100}{100 - \text{optical loss}}$$

The term "polarizer transmittance" refers to the transmittance of a polarizer; a configuration having no polarizer has a polarizer transmittance of 100. The term "aperture ratio" refers to the area of an emission region of each color relative to the area of a display region on the organic EL display. The aperture ratio of each color is usually 10% to 50%. In addition, the term "optical loss" refers to losses other than the loss due to the polarizer, including losses due to absorption in the organic compound layers of the organic light-emitting devices and the electrodes.

In the above equations, $l_R$, $l_G$, and $l_B$ are the luminance ratios of R, G, and B calculated using the chromaticities of R, G, B, and W on the CIE chromaticity coordinate system, namely, (Rx, Ry), (Gx, Gy), (Bx, By), and (Wx, Wy), by the following equation:

$$\begin{pmatrix} \frac{R_x}{R_y} & \frac{G_x}{G_y} & \frac{B_x}{B_y} \\ 1 & 1 & 1 \\ \frac{1-R_x-R_y}{R_y} & \frac{1-G_x-G_y}{G_y} & \frac{1-B_x-B_y}{B_y} \end{pmatrix}^{-1}$$ [Math. 2]

$$\begin{pmatrix} \frac{W_x}{W_y} \\ 1 \\ \frac{1-W_x-W_y}{W_y} \end{pmatrix} = \begin{pmatrix} l_R \\ l_G \\ l_B \end{pmatrix}$$

The parameter of $l_R$, $l_G$, and $l_B$ and $\eta_R$, $\eta_G$, and $\eta_B$ is the optical distance.

Figure 3:
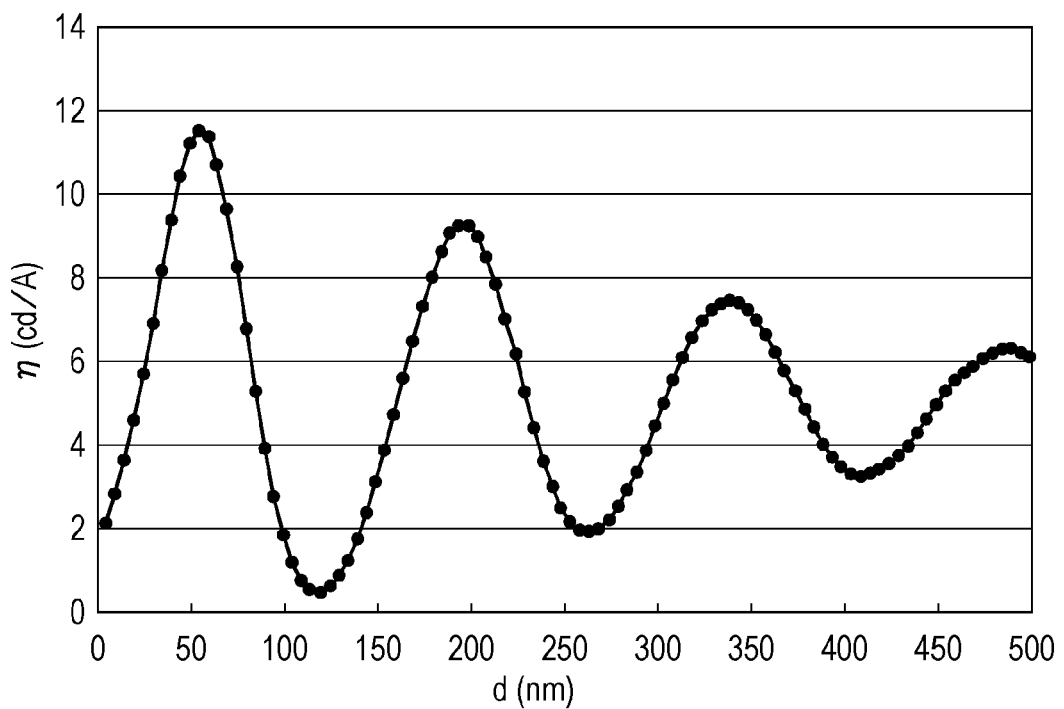
FIG. 3 is a graph showing the luminous efficiency η (cd/A) of organic EL devices of blue subpixels with varying optical distances d between an emission position in a light-emitting layer and a second reflective surface.
Figure 4:
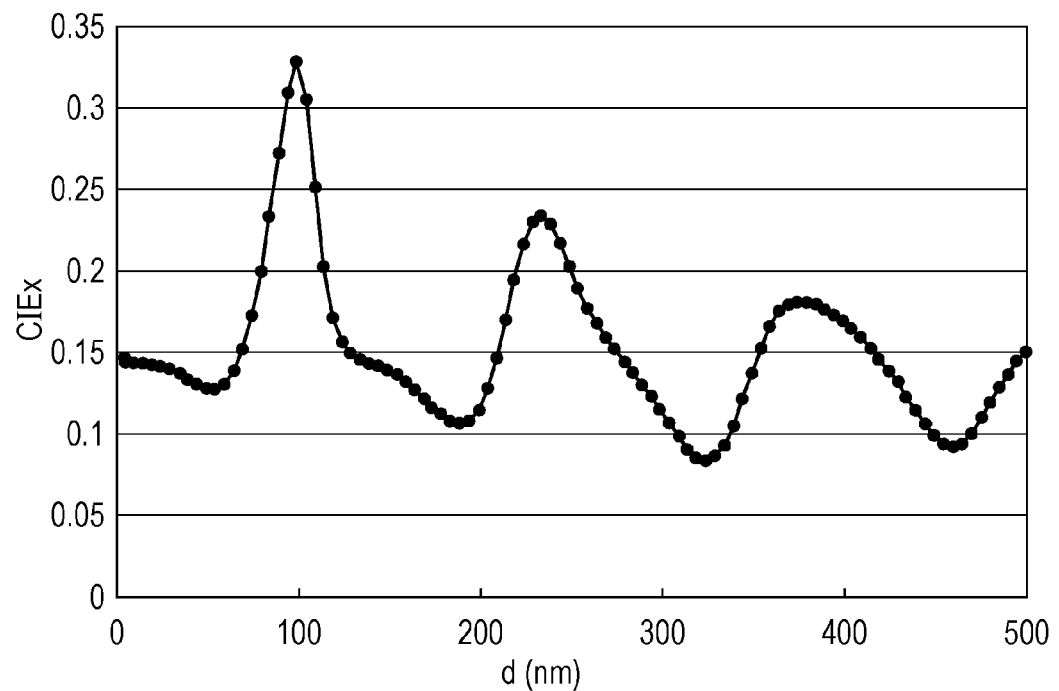
FIG. 4 is a graph showing the chromaticity (CIEx) of organic EL devices of blue subpixels with varying optical distances d between the emission position in the light-emitting layer and the second reflective surface.
Figure 5:
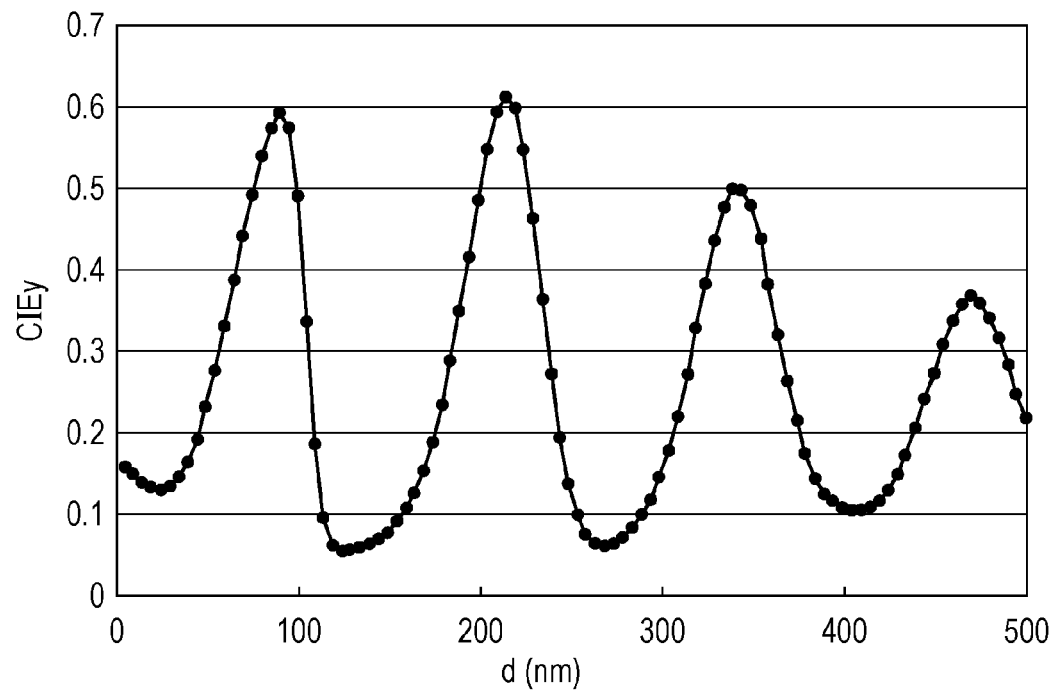
FIG. 5 is a graph showing the chromaticity (CIEy) of organic EL devices of blue subpixels with varying optical distances d between the emission position in the light-emitting layer and the second reflective surface.
Figure 6:
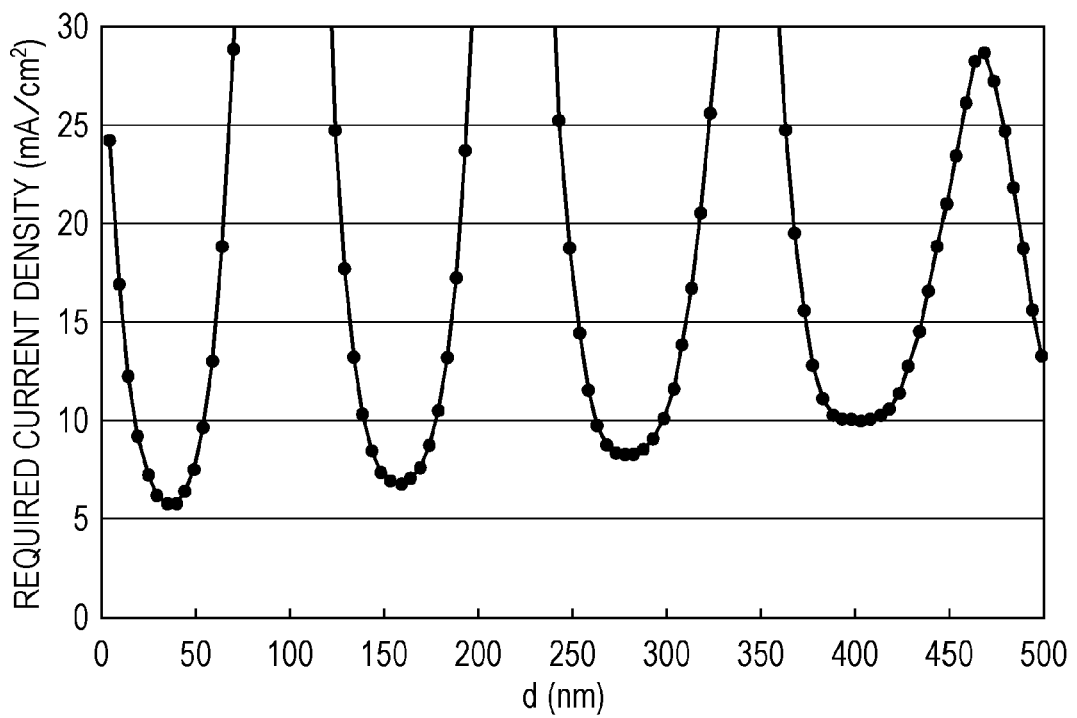
FIG. 6 is a graph showing the required current density of organic light-emitting devices of blue subpixels for display of white color at 250 cd/m$^2$.

In addition, FIG. 3 is a graph showing the luminous efficiency $\eta$ (cd/A) of organic EL devices of blue subpixels with varying optical distances d between the emission position in the light-emitting layer and the second reflective surface. FIG. 4 is a graph showing the chromaticity (CIEx) of organic EL devices of blue subpixels with varying optical distances d between the emission position in the light-emitting layer and the second reflective surface. FIG. 5 is a graph showing the chromaticity (CIEy) of organic EL devices of blue subpixels with varying optical distances d between the emission position in the light-emitting layer and the second reflective surface. FIG. 6 is a graph showing the required current density (mA/cm$^2$) of organic light-emitting devices of blue subpixels for display of white color at 250 cd/m$^2$.

FIG. 3 shows that the amplitude of the curve of the luminous efficiency η attenuates and converges to a certain value. This value is hereinafter referred to as the luminance convergence value. This is attributed to the fact that photoluminescence (PL) of a light-emitting material has a certain half-width. That is, the amplitude of the curve of the luminous efficiency η of the organic EL devices would not attenuate if the half-width was zero and the PL followed an impulse function (Dirac delta function); in practice, a light-emitting material with such PL has not been naturally found. The peak of the main spectrum of the light output from the organic EL devices and the adjacent ones interfere with and attenuate each other. Accordingly, higher-order extrema of the curve of the luminous efficiency η have lower absolute values.

Similarly, the amplitudes of the chromaticity (CIEx and CIEy) curves in FIGS. 4 and 5 attenuate and converge to a certain value.

Furthermore, FIG. 6 shows the required current density of organic EL devices produced with varying optical distances d between the emission position in the light-emitting layer and the second reflective surface, where the required current density is calculated by substituting the luminous efficiency and chromaticity of the organic EL devices into the expression $L_B/\eta_B$. That is, FIG. 6 plots the expression $L_B/\eta_B$ against the optical distance of the organic EL devices of the blue subpixels, where the chromaticities of R and G are provisionally fixed. FIG. 6 shows that the amplitude of the required current density of the organic EL devices attenuates and converges to a certain value under the effect of the curve of the luminous efficiency. As used herein, the term "point where the required current or power consumption is minimized" refers to all nth-order minima of the attenuation curve.

The power consumption of the panel is stable at an nth-order minimum of the attenuation curve because the required current varies gently even if the thickness varies. In addition, aspects of the present invention permit variations in optical distance within ±10% from the optical distance corresponding to the minimum. This is because the power consumption of the panel is sufficiently low and relatively stable even if there is a variation within ±10% from the optical distance corresponding to the minimum.

Figure 7:
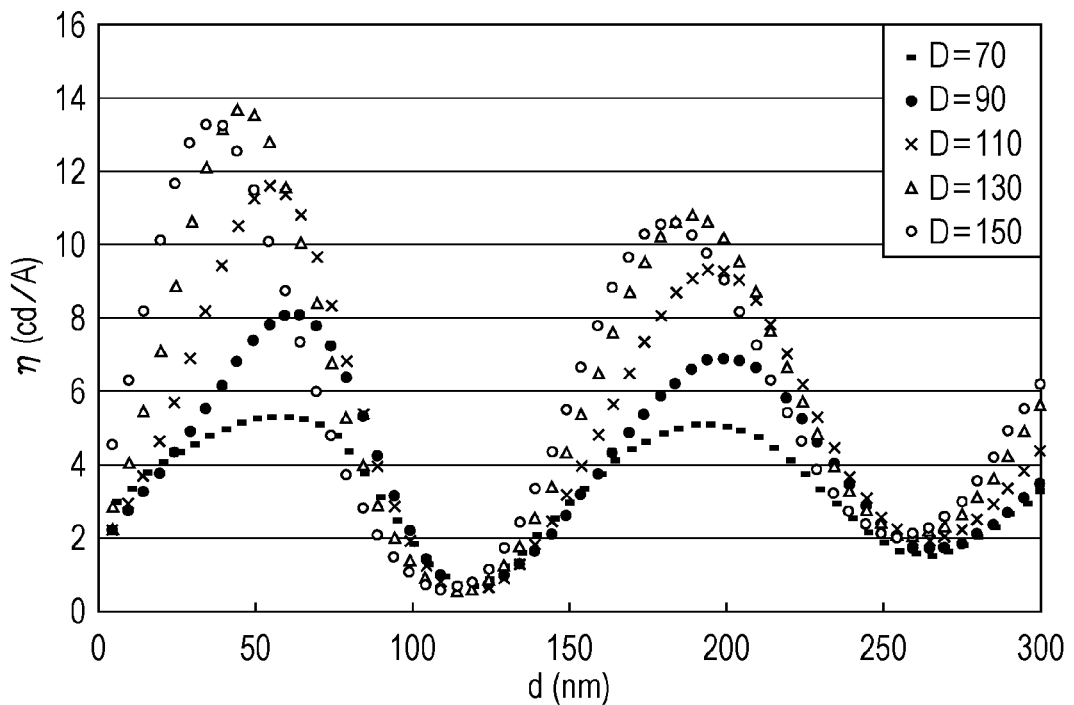
FIG. 7 is a graph showing the luminous efficiency η (cd/A) of organic EL devices with varying optical distances d between the emission position in the light-emitting layer and the second reflective surface.
Figure 8:
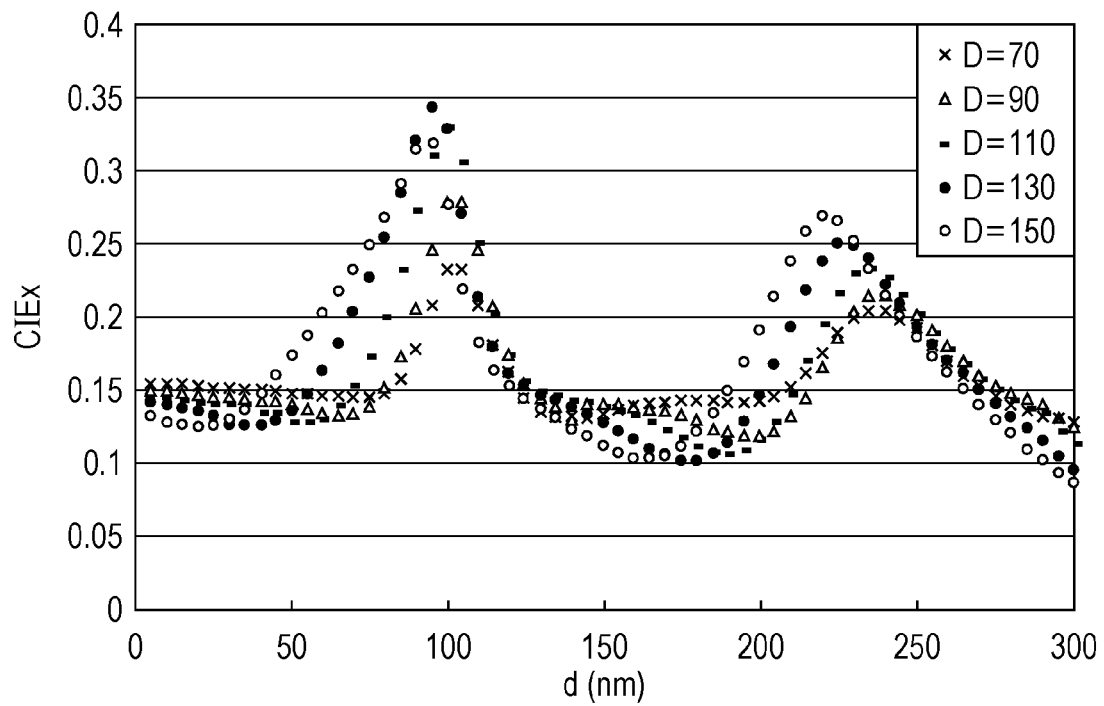
FIG. 8 is a graph showing the chromaticity (CIEx) of organic EL devices with varying optical distances d between the emission position in the light-emitting layer and the second reflective surface.
Figure 9:
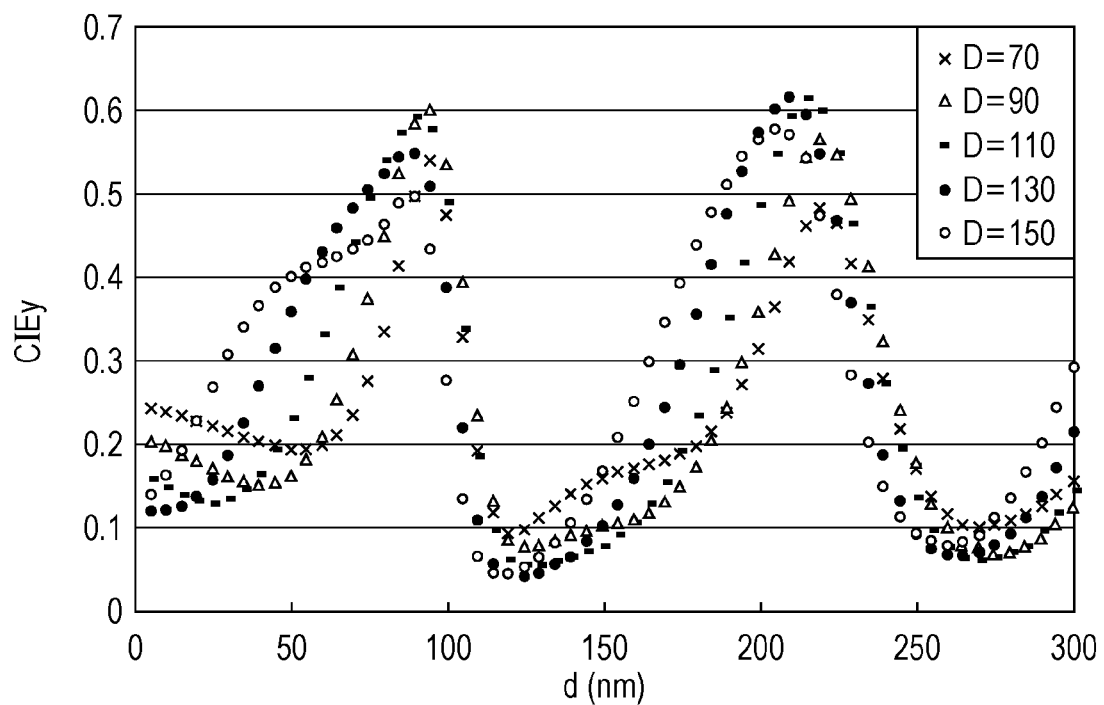
FIG. 9 is a graph showing the chromaticity (CIEy) of organic EL devices with varying optical distances d between the emission position in the light-emitting layer and the second reflective surface.
Figure 10:
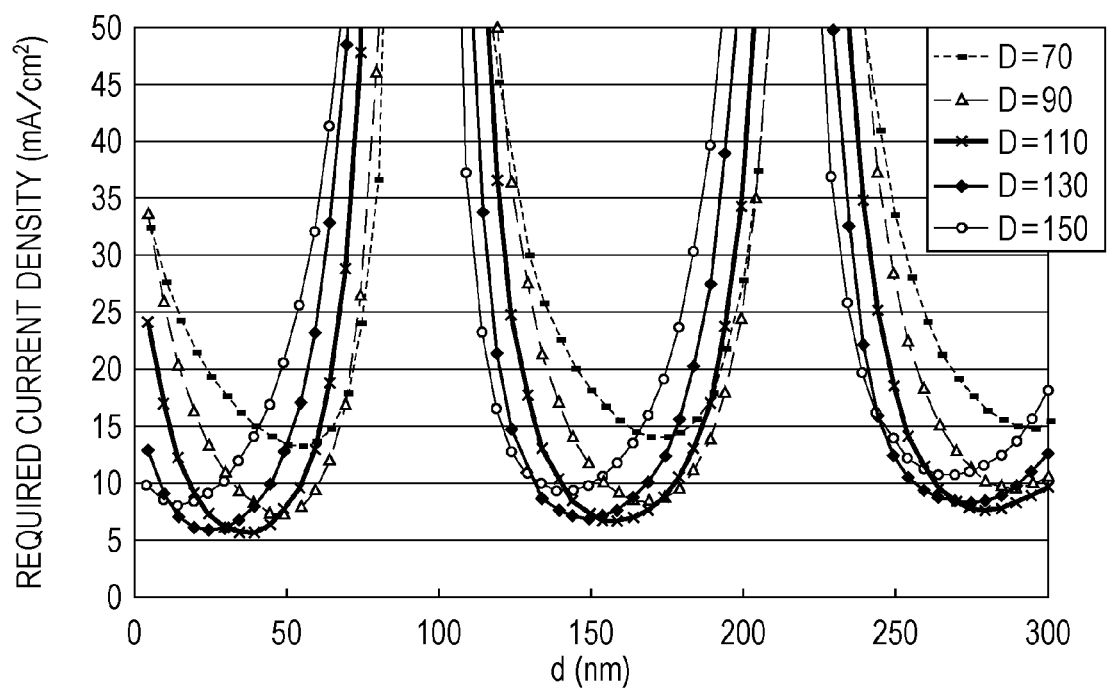
FIG. 10 is a graph showing the required current density of organic EL devices with varying optical distances d between the emission position in the light-emitting layer and the second reflective surface.

In this embodiment, additionally, the optical distance between the first and second reflective surfaces of the organic EL devices can be optimized. FIG. 7 is a graph showing the luminous efficiency η (cd/A) of organic EL devices with varying optical distances d between the emission position in the light-emitting layer and the second reflective surface. FIG. 8 is a graph showing the chromaticity (CIEx) of organic EL devices with varying optical distances d between the emission position in the light-emitting layer and the second reflective surface. FIG. 9 is a graph showing the chromaticity (CIEy) of organic EL devices with varying optical distances d between the emission position in the light-emitting layer and the second reflective surface. FIG. 10 is a graph showing the required current density of organic EL devices with varying optical distances d between the emission position in the light-emitting layer and the second reflective surface. In FIGS. 7 to 10, D is the optical distance between the emission position in the light-emitting layer and the first reflective surface.

The optical distance between the first and second reflective surfaces is expressed as the sum of the optical distance between the emission position in the light-emitting layer and the first reflective surface and the optical distance between the emission position in the light-emitting layer and the second reflective surface. In FIGS. 7 to 10, therefore, both the optical distance d between the emission position in the light-emitting layer and the second reflective surface and the optical distance D between the first and second reflective surfaces are optimized.

FIG. 7 shows that the amplitudes of the curves of the luminous efficiency η attenuate and converge to a luminance convergence value. Similarly, the amplitudes of the chromaticity (CIEx and CIEy) curves in FIGS. 8 and 9 attenuate and converge to a chromaticity convergence value.

Furthermore, FIG. 10 shows that the amplitude of the required current density for display of white color at 250 cd/m$^2$ attenuates and converges to a certain value. As used herein, as described above, the term "point where the required current or power consumption is minimized" refers to all nth-order minima of the attenuation curves. In addition, the power consumption of the display (panel) is stable near a point where the required current or power consumption is minimized because the required current varies gently even if the thickness varies.

Thus, the required current of the organic EL devices can be further reduced by optimizing not only the optical distance d of the organic EL devices between the emission position in the light-emitting layer and the second reflective surface, but also the optical distance D of the organic EL devices between the first and second reflective surfaces.

To set interference for each of R, G, and B, additionally, the thickness (optical distance) of the organic compound layer can be changed, for example, using a metal mask. In this case, an organic compound material with low electrical resistance can be used to form a thickness-adjusting layer. This is because a lower voltage decreases the power consumption of the organic EL display. In addition, the thickness-adjusting layer can be formed of an organic compound material that transmits light of the color of the corresponding organic EL devices. This is because a higher transmittance increases the luminance of the organic EL devices.

According to aspects of the present invention, additionally, the white chromaticity of the organic EL display can be freely set. For example, the white chromaticity can be set to the NTSC chromaticity coordinates, namely, (Wx, Wy)=(0.310, 0.316), or to the D65 standard chromaticity, namely, (Wx, Wy)=(0.31271, 0.32902).

The method described above, which minimizes the required current of the devices of the subpixels of one color when the organic EL display displays white color, requires the chromaticities of the other subpixels to be provisionally fixed in advance. To minimize the amount of current flowing through the entire organic EL display, therefore, the method disclosed herein can be repeatedly applied to the subpixels of the respective colors to sequentially optimize the optical thicknesses of the subpixels of the respective colors by induction. This method will now be described in detail.

In this method, first, the chromaticities of two of the three colors are provisionally fixed to optimize the optical thickness of the devices of the remaining color. For example, assume that the chromaticities of R and G are provisionally fixed to optimize the optical thickness of B. Next, because the chromaticity of the optimized devices is uniquely determined, the chromaticity of one of the two remaining colors is provisionally fixed.

For example, assume that the chromaticity of R is provisionally fixed and is used together with the chromaticity of B, which has already been optimized, to optimize the optical thickness of the G devices. Next, because the chromaticity of the optimized devices is uniquely determined, the optical thickness of the remaining color, namely, R, is optimized. Subsequently, the chromaticities of R and G are provisionally fixed again to reoptimize the optical thickness of B. As this process is repeated, the optical thicknesses of the R, G, and B subpixels converge to their respective optimum values, thus minimizing the amount of current flowing through the entire organic EL display.

If R, G, and B share the same supply voltage because of the layout of TFT wiring, the power consumption of the entire organic EL display is minimized when the amount of current flowing through the entire display is minimized. However, this does not apply to the case where R, G, and B use different supply voltages. In this case, the power consumption P of the entire display is represented by the following equation:

$$P = V_R \times I_R + V_G \times I_G + V_B \times I_B$$

where $V_R$ is the voltage applied to the R subpixels, $V_G$ is the voltage applied to the G subpixels, $V_B$ is the voltage applied to the B pixels, $I_R$ is the total current flowing through the R subpixels, $I_G$ is the total current flowing through the G subpixels, $I_B$ is the total current flowing through the B subpixels, $I_R = S \times i_R$, $I_G = S \times i_G$, and $I_B = S \times i_B$, where S is the emission area and i is the current density.

To minimize the power consumption P of the entire organic EL display, the above method needs to be applied taking into account the voltages applied to the subpixels.

As described above, the required current of the organic EL devices and the power consumption of the organic EL display are minimized by optimizing the optical distance of the organic EL devices between the emission position in the light-emitting layer and the second reflective surface and the optical distance between the first and second reflective surfaces.

According to aspects of the present invention, additionally, it is possible to use the second-order minimum of the curve of the required current against the optical distance of the organic EL devices between the emission position in the light-emitting layer and the second reflective surface. If the optical distance of the organic EL devices between the emission position in the light-emitting layer and the second reflective surface is short, a leakage current may occur between the anode and the cathode, thus causing a dark or bright spot. With the second-order minimum, the optical distance of the organic EL devices between the emission position in the light-emitting layer and the second reflective surface can be made reasonably long so that organic EL devices in which no leakage current occurs even if they contain some foreign substance can be produced. Thus, a leakage current can be prevented in the organic EL devices to improve the production yield of the organic EL display.

Whereas an embodiment of the present invention has been described above, this embodiment is an example illustrative of the present invention; it may be practiced in various manners different from the above embodiment without departing from the spirit of the present invention.

For example, whereas a display having a plurality of top-emission organic EL devices has been described as an example in the above embodiment, aspects of the present invention can also be applied to a display having a plurality of bottom-emission organic EL devices, which output light from the substrate side.

EXAMPLES

The organic EL display according to aspects of the present invention will now be described in greater detail with reference to the examples below, although aspects of the present invention are not limited thereto.

Example 1

An organic EL display of Example 1 had pixels including top-emission organic EL devices, each having a layered structure including an anode disposed on the substrate side and a cathode disposed on the light output side. In addition, the organic EL display of Example 1 had subpixels of three colors, namely, R, G, and B.

In Example 1, the optical distances of the R, G, and B organic EL devices between the end surface of the organic compound layer on the light output side and the first reflective surface were the same, and only the optical distances of the R, G, and B organic EL devices between the emission position in the light-emitting layer and the second reflective surface were different.

The method for producing the organic EL display of Example 1 will now be described with reference to FIG. 1 again. First, as shown in FIG. 1, a planarizing film having contact holes was formed on a substrate 1 having TFTs formed thereon. In FIG. 1, the TFTs, the planarizing film, and the contact holes are not shown.

Next, a silver alloy film was deposited to a thickness of 100 nm on the planarizing film in a vacuum apparatus by sputtering, an indium tin oxide (ITO) film was similarly deposited to a thickness of 10 nm by sputtering, and they were patterned to form the anodes 2. In FIG. 1, the silver alloy film and the ITO film are collectively shown as the anodes 2. The anodes 2 were connected to the TFTs via the contact holes. In addition, the silver alloy film served not only as the anodes 2, but also as the second reflective surfaces.

Next, a device isolation film (not shown) was formed by performing photolithography on an insulating layer formed on the anodes 2. This device isolation film was provided to isolate the pixels and subpixels so that they were independently driven by the TFTs.

Next, substrate pretreatment will be described. In the substrate pretreatment, first, the substrate 1 was heated for five minutes in a vacuum apparatus manufactured by ULVAC, Inc. so that the substrate temperature reached 100° C. The substrate 1 was then subjected to ozone cleaning by introducing dry air into the apparatus and irradiating the substrate 1 to ultraviolet radiation. Subsequently, the apparatus was evacuated, and the substrate 1 was heated for ten minutes.

After the pretreatment was completed, the hole transport layer 3 was formed. The hole transport layer 3 was formed using a hole transport material of structural formula HT1 below. The thickness of the hole transport layer 3 was varied for each of R, G, and B using a metal mask. The thickness of the hole transport layer 3 will be described later.

Subsequently, the electron blocking layer 4 was formed only in the B subpixels. In this example, no electron blocking layer 4 was formed in the R and G subpixels. Therefore, after the hole transport layer 3 was formed in the B subpixels, the substrate 1 was transferred to a chamber for depositing the electron blocking layer 4 without removing the metal mask from the substrate 1. An electron blocking material of structural formula HT2 below was deposited to a thickness of 10 nm.

[Chem. 1]

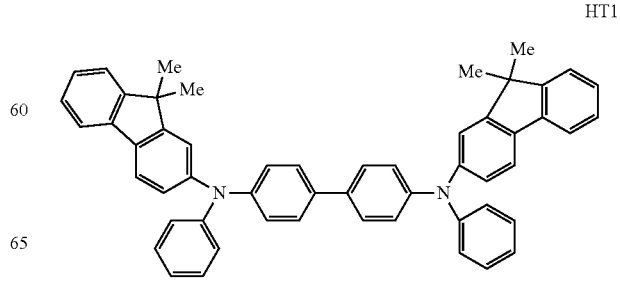

HT1

HT2

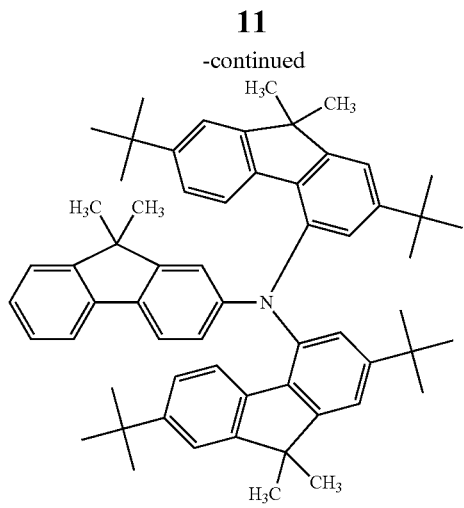

Next, the formation of the light-emitting layers 6, 7, and 8 will be described in detail. First, the formation of the G light-emitting layer 7 will be described. After the formation of the electron blocking layer 4, the metal mask was removed from the substrate 1. The metal mask was then aligned to the substrate 1 again to cover the R and B subpixels such that only the G subpixels were exposed, and the substrate 1 was transferred to a chamber for depositing the G light-emitting layer 7. The G light-emitting layer 7 was formed by codeposition of a green light-emitting dopant of structural formula GD8 below (10% by volume), an assist dopant of structural formula GD12 below (30% by volume), and a light-emitting-layer host material of structural formula GH3 below to a thickness of 45 nm. The emission position in the G light-emitting layer 7 was distributed closer to the substrate 1.

[Chem. 2]

GD8

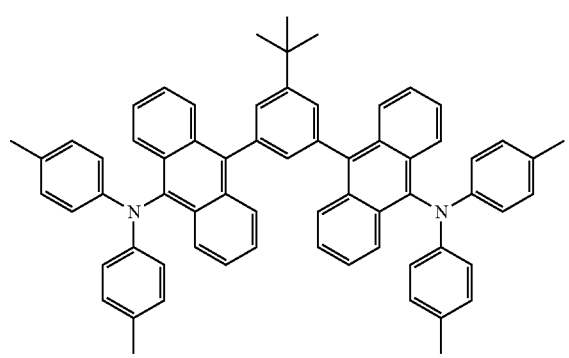

[Chem. 3]

GD12

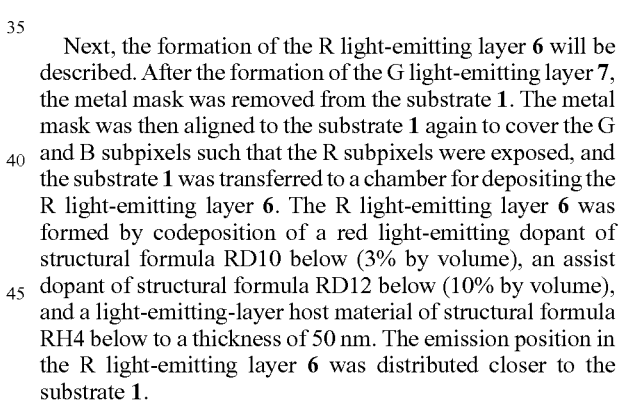

GH3

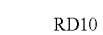

Next, the formation of the R light-emitting layer 6 will be described. After the formation of the G light-emitting layer 7, the metal mask was removed from the substrate 1. The metal mask was then aligned to the substrate 1 again to cover the G and B subpixels such that the R subpixels were exposed, and the substrate 1 was transferred to a chamber for depositing the R light-emitting layer 6. The R light-emitting layer 6 was formed by codeposition of a red light-emitting dopant of structural formula RD10 below (3% by volume), an assist dopant of structural formula RD12 below (10% by volume), and a light-emitting-layer host material of structural formula RH4 below to a thickness of 50 nm. The emission position in the R light-emitting layer 6 was distributed closer to the substrate 1.

RD10

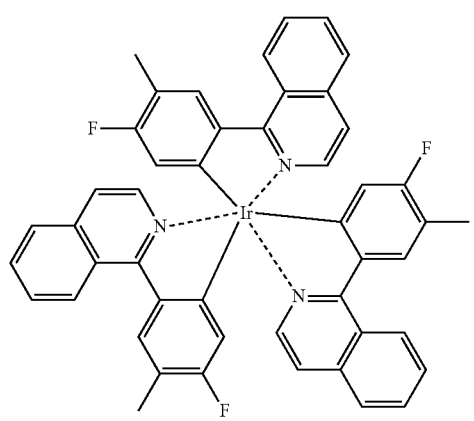

RD12

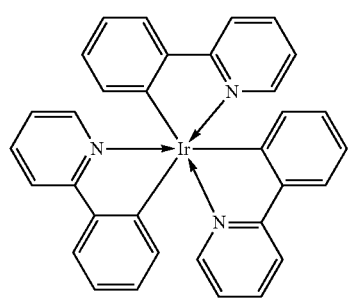

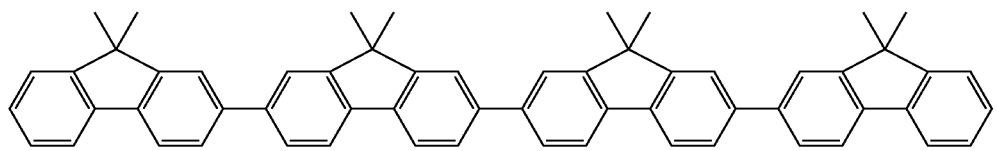

RH4

Finally, the formation of the B light-emitting layer 8 will be described. After the formation of the R light-emitting layer 6, the metal mask was removed from the substrate 1. The metal mask was then aligned to the substrate 1 to cover the G and R subpixels such that the B subpixels were exposed, and the substrate 1 was transferred to a chamber for depositing the B light-emitting layer 8. The B light-emitting layer 8 was formed by codeposition of a blue light-emitting dopant of structural formula BD12 below (5% by volume) and a light-emitting-layer host material of structural formula BH14 below to a thickness of 35 nm. The emission position in the B light-emitting layer 8 was distributed farther away from the substrate 1. Thus, the light-emitting layers 6, 7, and 8 were formed.

-continued

BH14

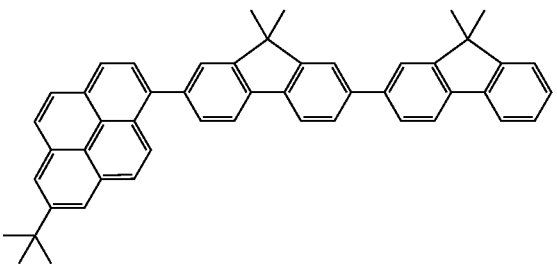

The remaining layers were common to R, G, and B. After the formation of the light-emitting layers 6, 7, and 8, the metal mask was removed from the substrate 1. The substrate 1 was transferred to a chamber for depositing the hole blocking layer 9. The hole blocking layer 9 was then formed by depositing an organic compound represented by structural formula HB1 below to a thickness of 10 nm.

Next, the substrate 1 was transferred to a chamber for depositing the electron transport layer 10. The electron transport layer 10 was then formed by depositing a phenanthroline compound represented by structural formula ET25 below to a thickness of 10 nm.

[Chem. 4]

BD12

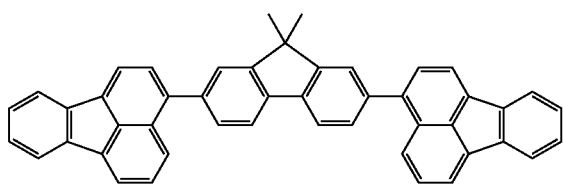

[Chem. 5]

HB1

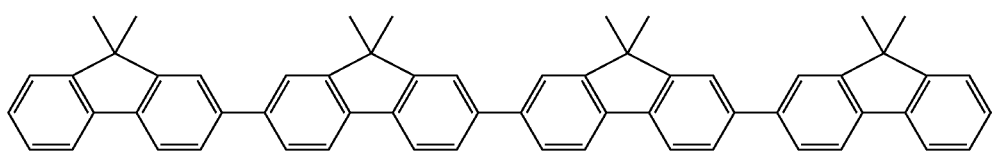

ET25

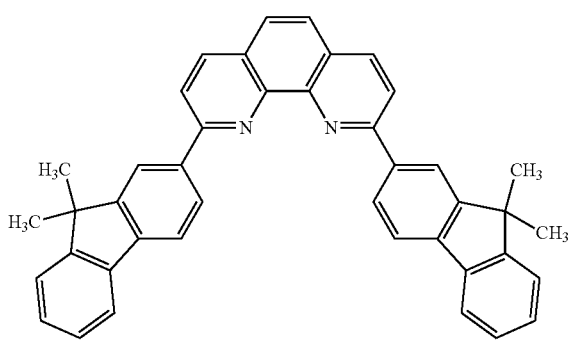

Next, after the formation of the electron transport layer 10, the electron injection layer 11 was formed. The substrate 1 was transferred to a chamber for depositing the electron injection layer 11. The electron injection layer 11 was then formed by codeposition of the phenanthroline compound represented by structural formula ET25 above and cesium carbonate to a thickness of 60 nm, where the deposition rate was adjusted such that the cesium concentration was 23% by weight.

Next, the cathode 12 was formed on the electron injection layer 11. The cathode 12 was formed by depositing silver to a thickness of 12 nm and then depositing indium zinc oxide (IZO) to a thickness of 60 nm by sputtering. The interface between the silver and IZO films served as the first reflective surface.

Finally, the substrate 1 was transferred to an $N_2$ atmosphere. An ultraviolet-curable resin was applied to the periphery of the substrate 1, was covered with a glass substrate, and was cured by ultraviolet irradiation with a mask placed thereon such that no ultraviolet radiation struck the pixel region.

The hole transport layer 3 of the red subpixels had a thickness of 220 nm, and the hole transport layer 3 of the green subpixels had a thickness of 167 nm. In this example, the chromaticity of the red subpixels on the CIE chromaticity coordinate system was (0.670, 0.330), and the chromaticity of the green subpixels on the CIE chromaticity coordinate system was (0.240, 0.698).

Figure 11:
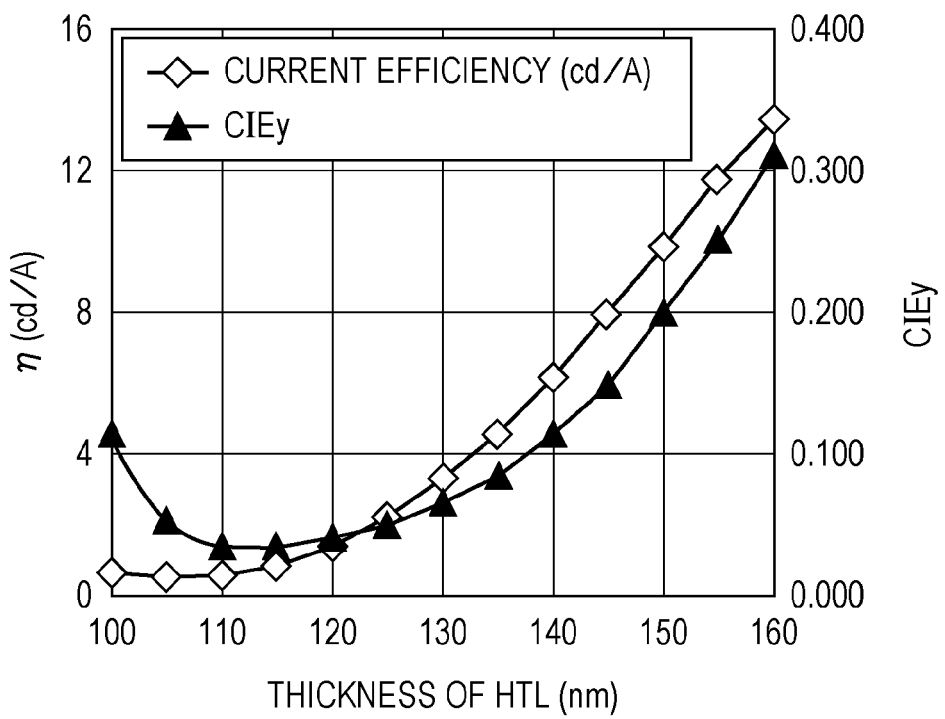
FIG. 11 is a graph showing current efficiency and CIEy against the thickness of a hole transport layer in Example 1.

The minimization of the power consumption required for display of a white color at 6,500 K will now be discussed. Variations in the characteristics of the blue subpixels with varying thicknesses of the hole transport layer (HTL), and therefore varying optical distances from the emission position in the organic compound layer and the second reflective surface, will be described with reference to FIGS. 11 and 12. FIG. 11 is a graph showing current efficiency and CIEy against the thickness of the hole transport layer (HTL). FIG. 11 shows that the extremum of CIEy is reached when the thickness of the hole transport layer (HTL) is 115 nm and that the maximum of the current efficiency is reached when the thickness of the hole transport layer (HTL) is 160 nm. If the hole transport layer (HTL) is thicker than 150 nm, no white color can be displayed because a white color at 6,500 K is outside the color reproduction range.

Figure 12:
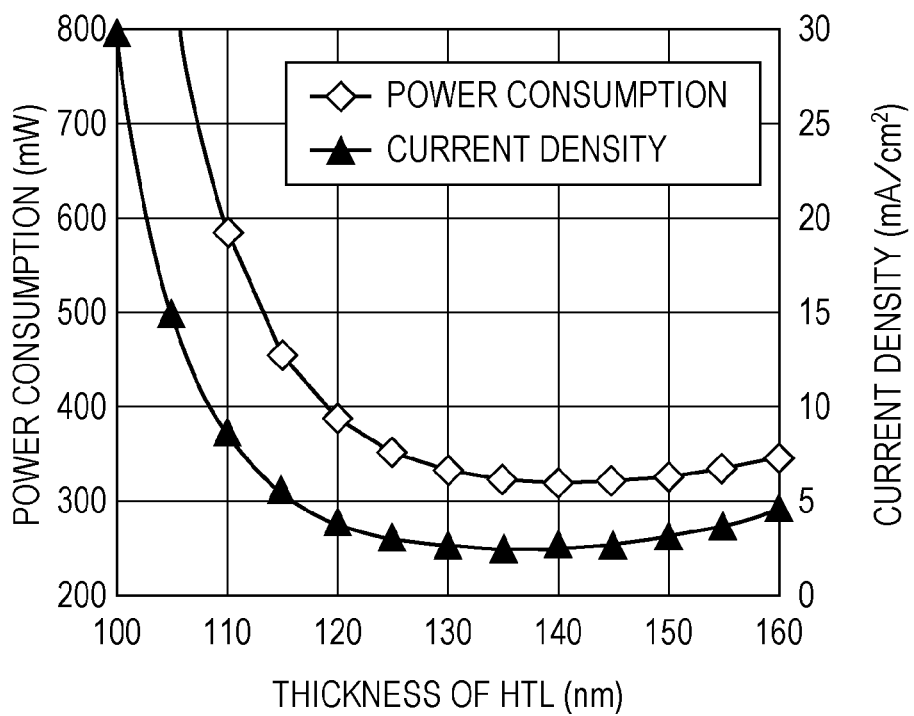
FIG. 12 is a graph showing the required current density and power consumption of blue subpixels for display of white color against the thickness of the hole transport layer in Example 1.

In addition, FIG. 12 is a graph showing the required current density and power consumption of the blue subpixels for display of white color against the thickness of the hole transport layer (HTL). As shown in FIG. 12, the required current density and power consumption of the blue subpixels are positively correlated. The thickness of the hole transport layer (HTL) at which the required current density is minimized, namely, 135 nm, is close to the thickness at which the power consumption is minimized.

Table 1 compares power consumption between Example 1, where the required current density of the blue subpixels was minimized, Comparative Example 1, where the extremum of CIEy was reached, and Comparative Example 2, where the current efficiency was maximized. As shown in Table 1, Example 1, where the required current density of the blue subpixels was minimized, had the lowest power consumption.

TABLE 1

| | Thickness of HTL (nm) | CIEx | CIEy | Efficiency (cd/A) | Power consumption (mW) |
|---|---|---|---|---|---|
| Example 1 | 135 | 0.128 | 0.083 | 4.5 | 324 |
| Comparative Example 1 | 115 | 0.153 | 0.035 | 0.9 | 455 |
| Comparative Example 2 | 160 | 0.097 | 0.311 | 13.3 | 348 |

In addition, the optical distances of the R and G devices between the emission position in the organic compound layer and the second reflective surface were calculated on the basis of the chromaticity of Example 1. As a result, the optical distances of the R and G devices in Example 1 between the emission position in the organic compound layer and the second reflective surface fell within the range of ±10% from the respective optical distances at which the required currents of the R and G devices were minimized.

Reference Example 2

An organic EL display of Reference Example 2 had R, G, and B light-emitting subpixels, and the structures of the R and G devices were the same as those in Example 1. In Reference Example 2, both the optical distance between the emission position in the organic compound layer and the second reflective surface and the optical distance between the emission position in the organic compound layer and the first reflective surface were optimized in the structure of the B devices. That is, the optical distance between the first and second reflective surfaces was also optimized.

The electron transport layer was separately formed in the R, G, and B subpixels using a metal mask such that the optical distances of the R and G devices between the emission position in the organic compound layer and the first reflective surface differed from the optical distance of the B devices between the emission position in the organic compound layer and the first reflective surface.

Figure 13:
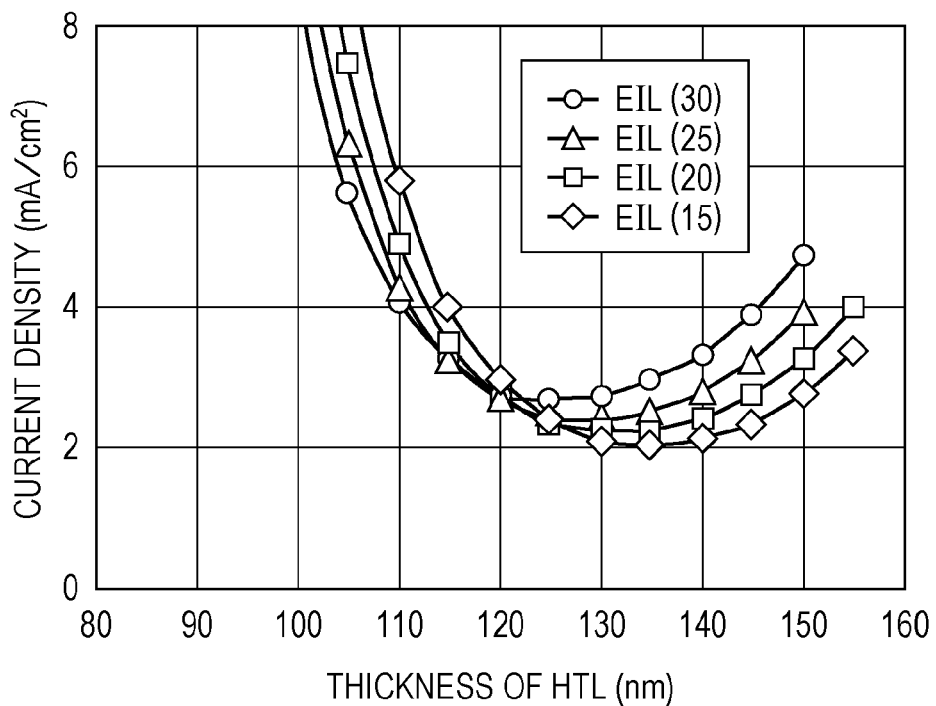
FIG. 13 is a graph showing variations in current density against the thickness of the hole transport layer for varying thicknesses of an electron injection layer.

The thickness of the electron injection layer (EIL) was varied for varying optical distances between the emission position in the organic compound layer and the first reflective surface, and the thickness of the hole transport layer (HTL) was varied for varying optical distances between the emission position in the organic compound layer and the second reflective surface. FIG. 13 shows variations in the required current density of the blue subpixels. FIG. 13 plots variations in current density (mA/cm$^2$) against the thickness of the hole transport layer (HTL) for varying thicknesses of the electron injection layer (EIL). As shown in FIG. 13, the thinner the electron injection layer (EIL) was, the lower the current density was.

Figure 14:
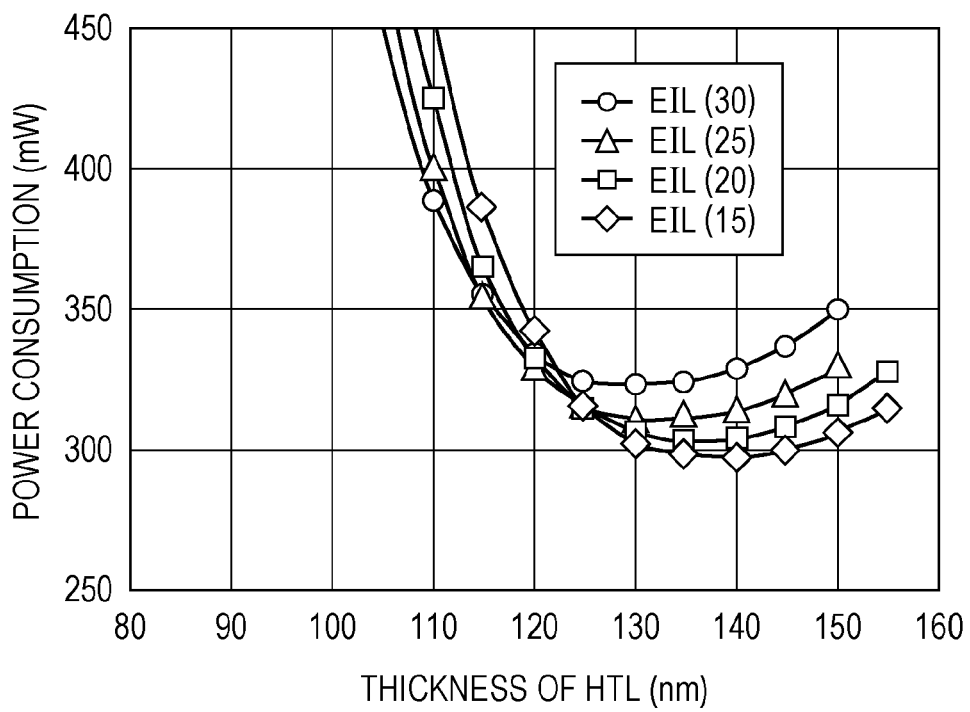
FIG. 14 is a graph showing variations in power consumption against the thickness of the hole transport layer for varying thicknesses of the electron injection layer.

In addition, FIG. 14 shows variations in power consumption. FIG. 14 plots variations in power consumption (mW) against the thickness of the hole transport layer (HTL) for varying thicknesses of the electron injection layer (EIL). As shown in FIG. 14, the thinner the electron injection layer (EIL) was, the lower the current density was, as was the required current density. This is because the thinner the electron injection layer (EIL) is, the more closely the optical distance between the emission point and the light output electrode matches the coherence length of blue.

The characteristics with which the required current density of the blue subpixels was minimized were as follows: the thickness of the electron injection layer (EIL) was 15 nm, the thickness of the hole transport layer (HTL) was 135 nm, CIEx was (0.130), CIEy was (0.085), the luminous efficiency was 6.1 cd/A, and the power consumption was 297 mW.

Accordingly, aspects of the present invention may provide an organic EL display having the amount of current required therefor and power consumption thereof minimized by simultaneously optimizing the luminous efficiency and chromaticity of organic EL devices.

While the present invention has been described with reference to exemplary embodiments, it is to be understood that aspects of the invention are not limited to the disclosed exemplary embodiments. The scope of the following claims is to be accorded the broadest interpretation so as to encompass all such modifications and equivalent structures and functions.

This application claims the benefit of Japanese Patent Application No. 2010-163790 filed Jul. 21, 2010, which is hereby incorporated by reference herein in its entirety.

What is claimed is:

1. An organic electroluminescent apparatus comprising:
an organic EL element emitting light of red color, an organic EL element emitting light of green color and an organic EL element emitting light of blue color,
wherein each of the organic EL elements includes a first electrode on a light output side, a second electrode opposite the first electrode, and an organic compound layer including a light-emitting layer between the first electrode and the second electrode,
wherein each of the organic EL elements has a resonator structure configured to resonate light emitted from the light-emitting layer between a first reflective surface closer to the first electrode than the organic compound layer and a second reflective surface closer to the second electrode than the organic compound layer, and
wherein an optical distance of the organic EL elements of each color between an emission position in the light-emitting layer and the second reflective surface is set within ±10% from an optical distance corresponding to an nth-order minimum of a curve of required current density, which is necessary when a predetermined white color is displayed by the organic EL element emitting light of red color, the organic EL element emitting light of green color and the organic EL element emitting light of blue color.

2. The organic electroluminescent apparatus according to claim 1, wherein the optical distance is set on the basis of a second-order minimum of the curve of required current density.

3. The organic electroluminescent apparatus according to claim 1, wherein an optical distance of the organic EL elements of each color between the first and second reflective surfaces is set within ±10% from an optical distance corresponding to an nth-order minimum of a curve of required current density against the optical distance between the emission position in the light-emitting layer and the second reflective surface and an optical distance between the emission position in the light-emitting layer and the first reflective surface.

4. An organic electroluminescent apparatus comprising:
an organic EL element emitting light of red color, an organic EL element emitting light of green color and an organic EL element emitting light of blue color,
wherein each of the organic EL elements includes a first electrode on a light output side, a second electrode opposite the first electrode, and an organic compound layer including a light-emitting layer between the first electrode and the second electrode,
wherein each of the organic EL elements has a resonator structure configured to resonate light emitted from the light-emitting layer between a first reflective surface closer to the first electrode than the organic compound layer and a second reflective surface closer to the second electrode than the organic compound layer, and
wherein an optical distance of at least one of the organic EL elements between an emission position in the light-emitting layer and the second reflective surface is set within ±10% from an optical distance corresponding to an nth-order minimum of a curve of required current density, which is necessary when a predetermined white color is displayed by the organic EL element emitting light of red color, the organic EL element emitting light of green color and the organic EL element emitting light of blue color.

5. The organic electroluminescent apparatus according to claim 4, wherein the optical distance of the organic EL elements which emit blue light between an emission position in the light-emitting layer and the second reflective surface is set within ±10% from an optical distance corresponding to an nth-order minimum of a curve of required current density.

6. The organic electroluminescent apparatus according to claim 4, wherein the optical distance is set on the basis of a second-order minimum of the curve of required current density.

7. The organic electroluminescent apparatus according to claim 4, wherein an optical distance of the organic EL elements of each color between the first and second reflective surfaces is set within +10% from an optical distance corresponding to an nth-order minimum of a curve of required current density against the optical distance between the emission position in the light-emitting layer and the second reflective surface and an optical distance between the emission position in the light-emitting layer and the first reflective surface.

* * * * *